United States Patent [19]

Buck et al.

[11] Patent Number: 4,663,542
[45] Date of Patent: May 5, 1987

[54] ELECTRONIC PROXIMITY SENSOR

[76] Inventors: Robert Buck, Vogelherdbogen 67, 7992 Tettnang 1; Gerd Marhofer, Beckmannsbusch 67, 4300 Essen-Bredeney, both of Fed. Rep. of Germany

[21] Appl. No.: 635,816
[22] Filed: Jul. 30, 1984
[30] Foreign Application Priority Data Jul. 29, 1983 [DE] Fed. Rep. of Germany ....... 3327329

[51] Int. Cl.[4] .................. H03K 3/26; H01M 41/12
[52] U.S. Cl. ................................. 307/308; 330/288; 328/5; 361/180
[58] Field of Search ................ 307/308, 580; 328/5; 361/179, 180; 331/65; 340/555; 330/288

[56] References Cited
U.S. PATENT DOCUMENTS 3,201,774  8/1965  Uemura ............................ 331/65
3,469,204  9/1969  Magyar et al. .................... 331/65
3,733,597  5/1973  Healey et al. .................... 307/580
4,336,491  6/1982  Buck et al. ...................... 328/5

Primary Examiner—Stanley D. Miller
Assistant Examiner—B. P. Davis

[57] ABSTRACT

An electronic sensor of the contactless type has a free-running oscillator with internal positive feedback supplemented by an external negative feedback including a capacitive path whose impedance is normally high but is lowered in the presence of an object to be detected, thereby reducing the output signal of the oscillator from a normal amplitude above a predetermined level to a diminished amplitude below that level. The negative feedback is provided through an IGFET, e.g. of n-channel depletion type, with the aid of a capacitor bridging its source and gate electrodes to form with the external capacitance a voltage divider for the output signal of the oscillator.

6 Claims, 3 Drawing Figures

ELECTRONIC PROXIMITY SENSOR

FIELD OF THE INVENTION

Our present invention relates to an electronic proximity sensor, preferably of the contactless type, in which a receiver detects incoming signals indicative of the presence of an object in a predetermined area.

BACKGROUND OF THE INVENTION

Such proximity sensors are known in a variety of configurations, e.g. as disclosed in our U.S. Pat. No. 4,193,023 and earlier patents referred to therein. In all these cases the output of the proximity sensor is fed to a control circuit which either energizes or de-energizes a load when the object comes within a predetermined distance from the observation point or occupies a certain position relative thereto; the load could be a simple indicator (visual or aural, for example) and/or a switch starting or stopping an associated mechanism. Devices of this character can also be used as quantitative indicators of the distance of a nearby object from a reference point.

A distinction can be made between two types of contactless proximity sensors, namely those which respond inductively and those which respond capacitively to the approach of an external object.

A conventional capacitive sensor comprises and oscillator which is inoperative until an external capacitance including the object completes a tank circuit therefor. Inductive sensors, on the other hand, have free-running oscillators with tank circuits whose inductive branches have their impedances modified by the approaching object. Generally, sensors of the latter type have fewer problems than the capacitive ones, on account of the continuous oscillation generation. Inductive sensors, moreover, are found to have a more favorable ratio of induced damping to inherent damping. Still, certain objects—e.g. those of low conductivity—are more readily detectable by capacitive sensors.

OBJECT OF THE INVENTION

The object of our present invention, therefore, is to provide an improved and preferably contactless proximity sensor combining the best features of the two types of sensors discussed above.

SUMMARY OF THE INVENTION

In accordance with our invention, a proximity sensor for detecting the presence of an external object comprises a free-running oscillator, including an amplifier element provided with internal positive feedback, and a negative-feedback path which is connected between an input and an output of the amplifier element, this path including an external impedance which is reducible in magnitude under the influence of the object to be detected whereby the amplitude of an output signal generated by the oscillator is diminished by such approach below a normal minimum level.

When the external impedance is an inverted capacitance, as is the case in the preferred embodiments described hereinafter, the sensor operates in a contactless manner. In principle, however, that impedance could also be a resistance modifiable by contact with the external object so as to reduce the signal amplitude of the free-running oscillator.

Advantageously, pursuant to a more particular feature of our invention, the negative-feedback path of the oscillator includes a sensing transistor with an input electrode and a control electrode bridged by a coupling capacitor forming with the variable external capacitance a voltage divider for the oscillator signal. We prefer to use an IGFET (insulated-gate field-effect transistor) as the sensing transistor, with the coupling capacitor inserted between its source and gate electrodes.

The positive internal feedback path of the amplifier element, necessary to maintain its oscillations, may be provided by a current mirror coupling that amplifier element with an LC-type tank circuit. The amplifier element may be a junction transistor having a base and an emitter effectively connected across the tank circuit with an emitter resistor interposed therebetween.

BRIEF DESCRIPTION OF THE DRAWING

The above and other features of our invention will now be described in detail with reference to the accompanying drawing in which.

SPECIFIC DESCRIPTION

Figure 1:
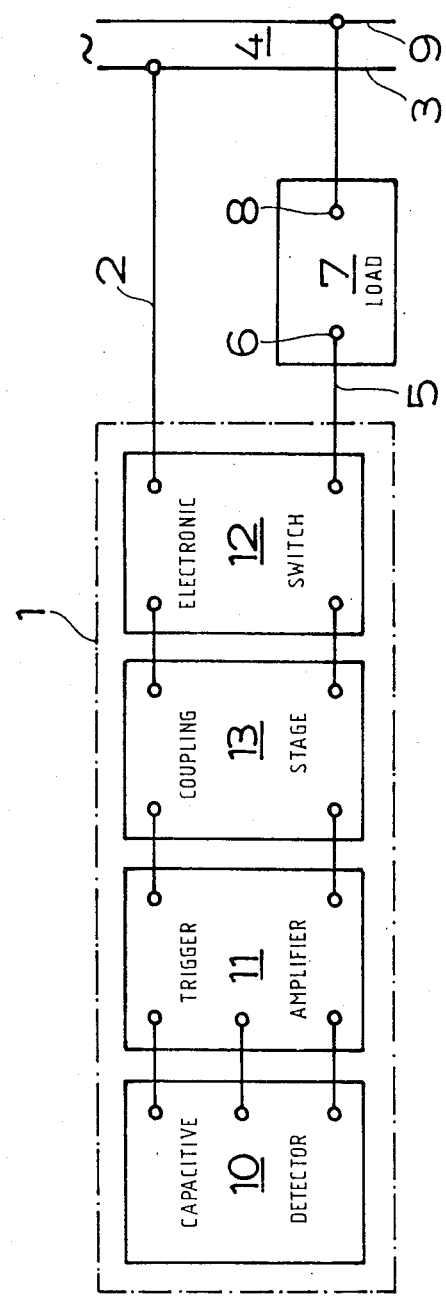
FIG. 1 is a block diagram of a proximity sensor embodying this invention.

FIG. 1 shows a block diagram, similar to one illustrated in U.S. Pat. No. 4,117,393, comprising a proximity sensor 1 with two external wires 2, 5 connected across a source 4 of alternating current with two conductors 3 and 9; a current-responsive load 7, e.g. a relay, a switch or a meter, is interposed between leads 5 and 9 and has terminals 6 and 8 respectively connected thereto. The presence of only two external wires is not critical.

The components of sensor 1 include an amplifier 11 controlling an electronic switch 12, e.g. a thyristor, and a coupling stage 13 therebetween. An input circuit 10, working into trigger amplifier 11, comprises a capacitive detector more fully described hereinafter with reference to FIGS. 2 and 3.

Figure 2:
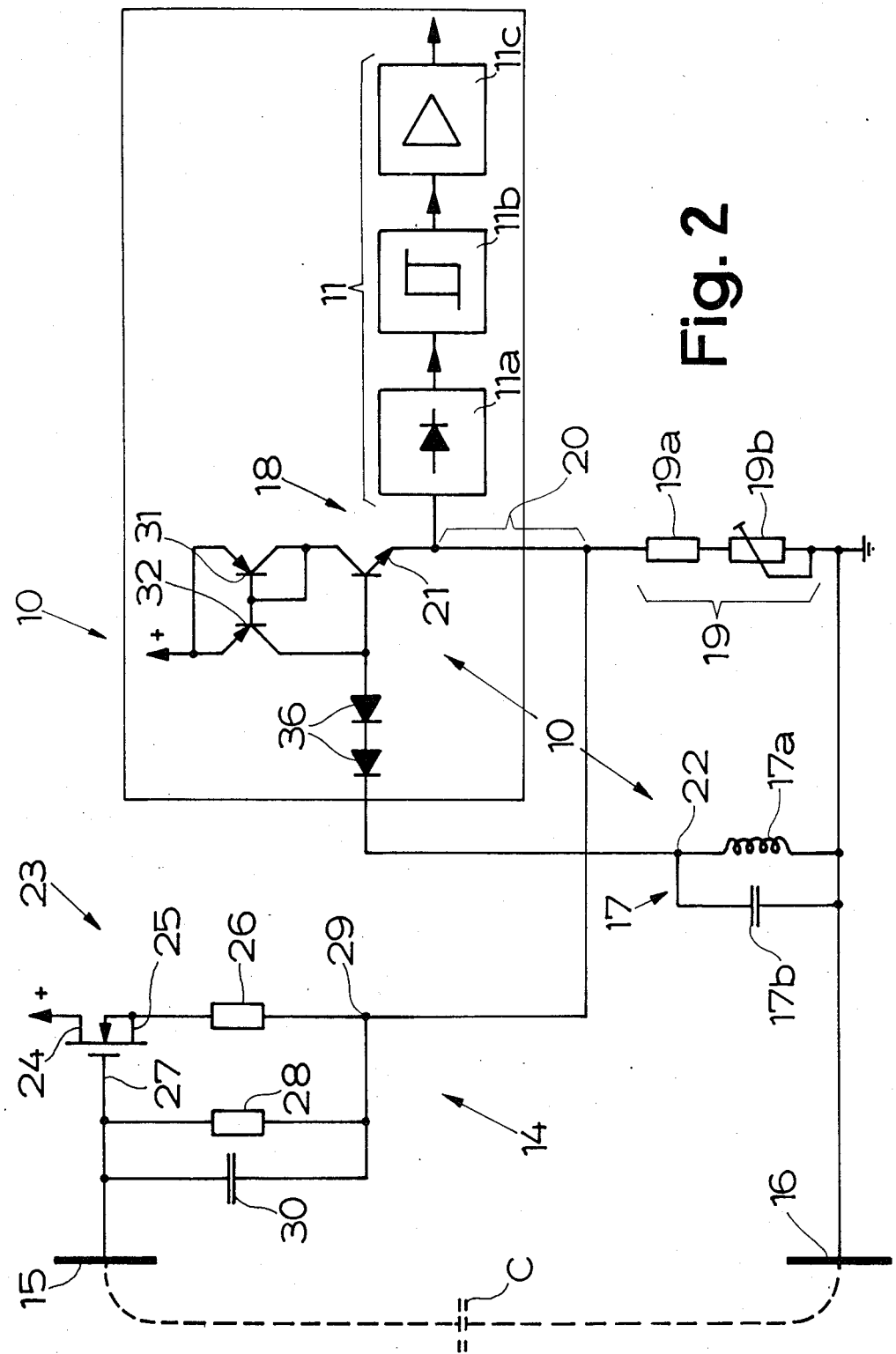
FIG. 2 is a detailed circuit diagram of the novel components of the embodiment of FIG. 1.

As shown in FIG. 2, detector 10 comprises a free-running oscillator with an NPN main transistor 18 whose emitter 21 forms an output junction 20 to which the amplifier 11 is connected. This amplifier is here shown as including a rectifier 11a, a threshold circuit 11b and an amplification stage 11c working into the load 7 of FIG. 1. The emitter is grounded through a resistor 19 including a fixed series branch 19a and an adjustable series branch 19b. A positive terminal (+) of a direct-current source is coupled to the collector of junction transistor 18 by way of a PNP transistor 31, connected as a diode, constituting a current mirror with a similar transistor 32 inserted between positive potential and the base of transistor 18. Two biasing diodes 36 lie between that base and an ungrounded terminal 22 of an LC network or tank circuit 17 including an inductance 17a and a capacitance 17b.

An IGFET 23 of n-channel depletion type has a gate 27 connected to a monitoring electrode 15, a drain 24 connected to positive potential and a source 25 connected through a resistor 26 to output junction 20 and thus to emitter 21. Monitoring electrode 15 forms with a grounded reference electrode 16 an external capacitance C, normally of very low value. A capacitor 30, bridged by a gate resistor 28, lies between gate 27 and the series combination of source 25 and resistor 26, forming a junction point 29 with that resistor. IGFET 23, resistors 26, 28 and capacitor 30 constitute an amplitude-modifying network 14 which is part of a negative-impedance path including the external reluctance 1/C. This path extends from output junction 20, i.e. from the emitter 21 of transistor 18, to ground at reference electrode 16.

Normally, in the absence of an external object to be detected, the negative feedback supplied by network 14 is negligible so that transistor 18 operates with a maximum swing amplitude, at the frequency determined by tank circuit 17, to energize trigger amplifier 11. A substantially constant biasing current, determined by resistor 26, passes at that time through IGFET 23 and emitter resistor 19. When the external reluctance 1/C is significantly reduced by an external object effectively augmenting capacitance C, a substantial alternating current branched off from emitter resistor 19 passes through capacitor 30 and gate resistor 28 in parallel; the latter resistor serves to prevent major phase deviations between source 25 and gate 27. The large voltage swing across circuit 28, 30 now significantly modulates the aforementioned biasing current in a sense opposing the fluctuations in the voltage of emitter 21 dictated by the positive feedback signal applied to the base of transistor 18. This largely diminishes—but does not extinguish—the amplitude of the oscillations fed from output junction 20 to amplifier 11 and thus to the load.

Figure 3:
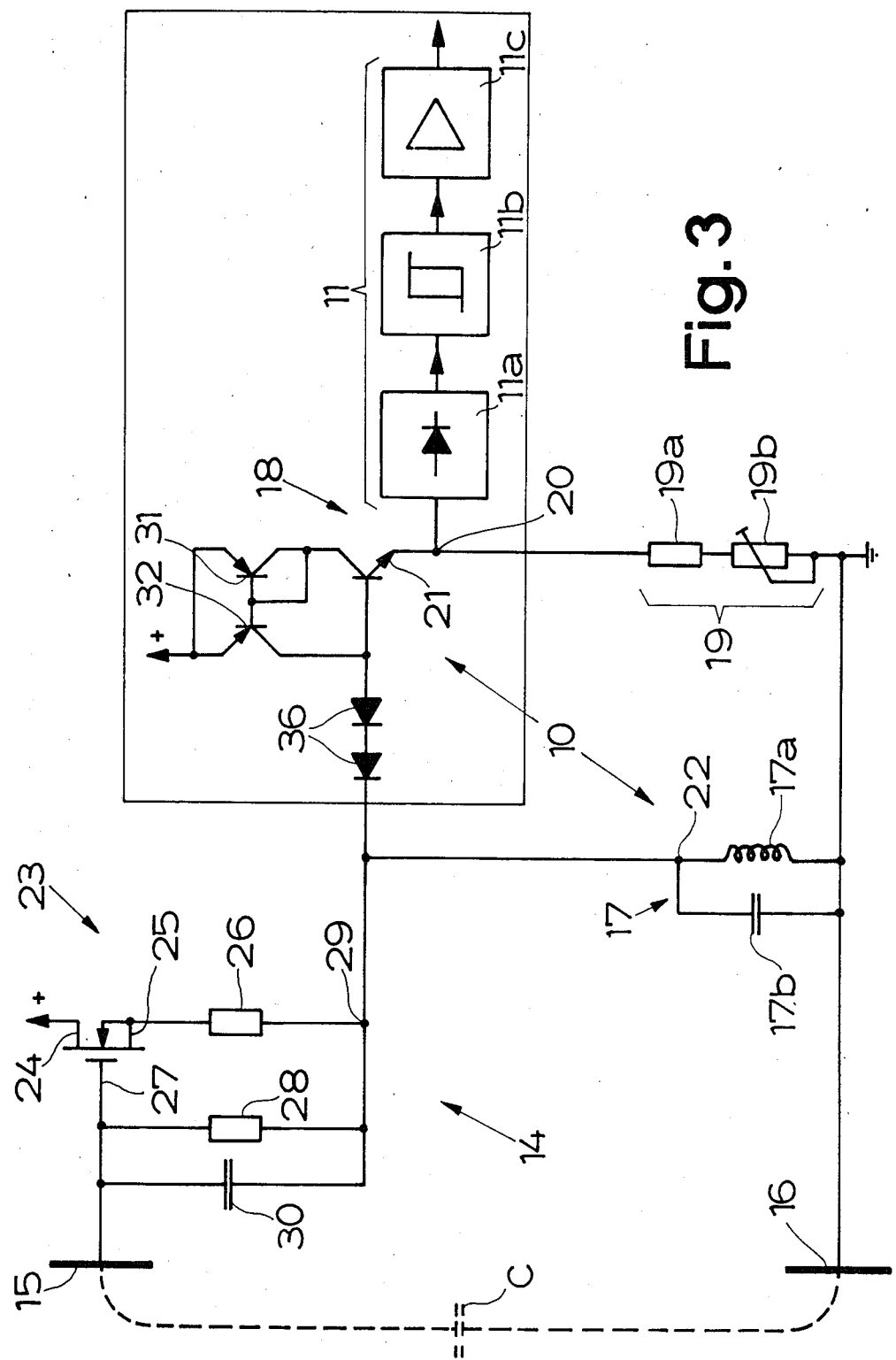
FIG. 3 is a diagram similar to that of FIG. 2, illustrating a modification.

In FIG. 3 we have shown a modification of the capacitive detector 10 of FIG. 2 wherein, with everything else unchanged, junction point 29 is now connected to the ungrounded terminal 22 of tank circuit 17 which energizes the base of transistor 18 via diodes 36. Here, the biasing current passed by IGFET 23 traverses the inductive branch 17a of circuit 17 instead of the emitter resistor 19. The negative-feedback effect modulating this biasing current in an approach situation, however, is analogous to that described with reference to FIG. 2.

A further modification, not shown, involves the disconnection of source resistor 26 from junction point 29 in the circuitry of FIG. 3 and a connection of that resistor to output junction 20, as in FIG. 2. Other possible modifications include the use of an enhancement-type IGFET connected across tank circuit 17 or emitter resistor 19 rather than in series therewith as in the illustrated embodiments. With inverted polarities, such an IGFET may also be of p-channel type.

From what has been stated above, it will be apparent that in a sensor not requiring contactless operation the external reluctance 1/C may be supplemented or replaced by an ohmic impedance whose resistance is significantly decreased by direct or indirect contact with an approaching object.

We claim:

1. An electronic proximity sensor for contactless detection of an approaching object, comprising:
   a free-running oscillator including an amplifier element provided with internal positive feedback; and
   a negative-feedback path connected between an input and an output of said amplifier element, said path including an external impedance reducible in magnitude under the influence of an object to be detected whereby the amplitude of an output signal generated by said oscillator is diminished by such approach below a normal minimum level,
   wherein said external impedance is an inverted variable capacitance defined by a monitoring electrode and a reference electrode,
   wherein said path further includes a sensing transistor with an input electrode and a control electrode bridged by a coupling capacitor forming with said variable capacitance a voltage divider for said output signal,
   wherein said sensing transistor is an IGFET with a source electrode and a gate electrode constituting said input and control electrodes,
   wherein with said amplifier element energized by a d-c current supply with a positive terminal and a grounded terminal, said IGFET is of n-channel depletion type having a drain electrode connected to said positive terminal, and
   wherein said amplifier element is a junction transistor coupled with a tank circuit via a current mirror providing said internal positive feedback, said tank circuit lying between ground and a base of said junction transistor having an emitter-collector network in series with said d.c. current supply.

2. A proximity sensor as defined in claim 1 wherein said junction transistor has an emitter connected to a load and grounded through an emitter resistor.

3. A proximity sensor as defined in claim 2 wherein said emitter resistor is adjustable.

4. A proximity sensor as defined in claim 2 wherein said coupling capacitor is shunted by a gate resistor, said source electrode being in series with a source resistor forming a junction point with said gate resistor.

5. A proximity sensor as defined in claim 4 wherein said junction point is connected to said emitter.

6. A proximity sensor as defined in claim 4 wherein said junction point is connected to an ungrounded terminal of said tank circuit coupled to said base.

* * * * *